United States Patent
Roitman et al.

[11] Patent Number: 6,137,221
[45] Date of Patent: Oct. 24, 2000

[54] ORGANIC ELECTROLUMINESCENT DEVICE WITH FULL COLOR CHARACTERISTICS

[75] Inventors: Daniel B. Roitman, Menlo Park; James R. Sheats, Palo Alto, both of Calif.

[73] Assignee: Agilent Technologies, Inc., Palo Alto, Calif.

[21] Appl. No.: 09/111,474

[22] Filed: Jul. 8, 1998

[51] Int. Cl.[7] .................................................. H01J 1/62
[52] U.S. Cl. .......................................................... 313/504
[58] Field of Search ................................... 313/503, 504, 313/505, 506, 509, 511; 430/7; 445/22, 24

[56] References Cited

U.S. PATENT DOCUMENTS

| | | | |
|---|---|---|---|
| 5,126,214 | 6/1992 | Tokailin et al. | 428/690 |
| 5,705,285 | 1/1998 | Shi et al. | 313/503 |
| 5,986,400 | 11/1999 | Staring et al. | 313/503 |

*Primary Examiner*—Nimeshkumar D. Patel
*Assistant Examiner*—Todd Reed Hopper

[57] ABSTRACT

An organic polymer based display and method for making the same. The display is constructed on a flexible sheet having first and second surfaces, the first and second surfaces being parallel to one another. The flexible sheet is transparent to light of a first wavelength. A first electrode, which includes a first electrode layer in contact with the first surface, is deposited on the flexible sheet. The first electrode layer is also transparent to light of the first wavelength. A light-emitting layer that includes an organic polymer is deposited on the electrode layer. A second electrode that includes a second electrode layer in contact with the light emitting layer is deposited on the light-emitting layer. The light emitting layer generates light of the first wavelength when a potential difference is applied across the first and second electrodes. A light conversion layer is deposited in contact with the second surface of the flexible sheet. The light conversion layer absorbs light of the first wavelength and emitting light of a second wavelength. In an addressable pixelated display, the light conversion layer and one of the first or second electrodes are patterned as parallel strips overlying one another.

9 Claims, 2 Drawing Sheets

ORGANIC ELECTROLUMINESCENT DEVICE WITH FULL COLOR CHARACTERISTICS

FIELD OF THE INVENTION

The present invention relates to electroluminescent devices, and more particularly, to an improved organic light emitting display for use in matrix-addressed displays.

BACKGROUND OF THE INVENTION

Organic light emitting devices (OLED's) are emissive displays consisting of a transparent substrate coated with a transparent conducting material, such as Indium Tin oxide (ITO), one or more organic layers and a cathode made by evaporating or sputtering a metal of low work function characteristics, such as Ca or Mg. The organic layers are chosen so as to provide charge injection and transport from both electrodes into the electroluminescent organic layer (EL) where the charges recombine, emitting light. There may be one or more organic hole transport layers (HTL) between the ITO and the EL, as well as one or more electron injection and transporting layers (EL) between the cathode and the EL.

To fabricate multicolor and full color displays, two approaches have been proposed. The first approach consists of depositing emitting materials with different spectral characteristics. Each of these materials (typically one material with red emission, one for green and one for blue) is deposited separately in different parts of the substrate to achieve "full color" (RGB) pixels by separately powering the three color pixels.

The second approach consists of depositing a single emissive material and using (RGB) filters, resonant cavities and/or photoluminescent materials that can absorb the light from the emissive material and re-emit light at longer wavelengths (green and red). This approach requires that the emissive material has a substantial emission in the blue. In one prior art device (U.S. Pat. No. 5,126,214), the wavelength converting layers are deposited on a glass substrate as rows of green and red dyes dispersed in polymer films. Rows of blue filtering material are also deposited on the glass to enhance the blue emission of the device. A planarization layer is then applied over the wavelength converting layers. The ITO electrodes are then patterned over the planarized layer. A blue emitting dye is deposited over the ITO. The remaining layers of the OLED are then deposited as described above.

Devices based on color conversion do not require that the electroluminescent characteristics of three different emissive materials be balanced. This is very difficult to achieve in practice because the voltage-current characteristics and quantum efficiencies are usually very different for each material. EL lifetimes are also quite difficult to equalize between different materials.

Unfortunately, the color conversion system has its own problems. To prevent color anomalies when the device is viewed at an angle different from the normal to the surface, the emissive material and the color conversion material must lie very close to each other. This is particularly difficult to achieve with pixels that are less than 0.5 mm because of the thickness of the planarization material and the lack of uniformity in height of the color conversion materials. In general, the thickness of the color conversion layer for converting blue light to red light is significantly greater than the thickness of the layer for converting the blue light to green light. For example, the thickness of color conversion layers disclosed in U.S. Pat. No. 5,126,214 ranges from 80 to 800 microns. Accordingly, there is a gap that is filled with the planarization material over the green conversion material. This gap places a limit on the distance between the light emissive material and the green and blue conversion materials.

The need to provide the planarization layer also increases the complexity and cost of fabrication. The planarization step increases the number of steps in the fabrication process, and hence, increases the cost of fabrication. Cost of fabrication is particularly important in OLED displays, since such displays are being explored as a lower cost alternative to other display technologies.

Finally, prior art color conversion systems do not lend themselves to the production of flexible displays. One advantage of OLED based displays is the promise of providing flexible displays for use in automobile control panels in which the display would be bonded to a curved surface to improve its visibility. The color conversion layers and subsequent planarization step require the use of rigid glass substrates which increase the cost and weight of the displays in addition to preventing the displays from flexing.

Broadly, it is the object of the present invention to provide an improved OLED display.

It is a further object of the present invention to provide an OLED display based on color conversion that does not require the planarization layer utilized in prior art displays.

It is a still further object of the present invention to provide an OLED display in which the distance between the emissive layer and the color conversion layers is constant for all of the color conversion materials.

It is yet another object of the present invention to provide a flexible OLED display based on color conversion.

These and other objects of the present invention will become apparent to those skilled in the art from the following detailed description of the invention and the accompanying drawings.

SUMMARY OF THE INVENTION

The present invention is an OLED display and method for making the same. A display according to the present invention is constructed on a flexible sheet having first and second surfaces, the first and second surfaces being parallel to one another. The flexible sheet is transparent to light of a first wavelength. A first electrode, which includes a first electrode layer in contact with the first surface, is deposited on the flexible sheet. The first electrode layer is also transparent to light of the first wavelength. A light-emitting layer that includes an organic polymer is deposited on the electrode layer. A second electrode that includes a second electrode layer in contact with the light emitting layer is deposited on the light-emitting layer. The light emitting layer generates light of the first wavelength when a potential difference is applied across the first and second electrodes. A light conversion layer is deposited in contact with the second surface of the flexible sheet. The light conversion layer absorbs light of the first wavelength and emits light of a second wavelength. In one embodiment of the invention, the light conversion layer and one of the first or second electrodes are patterned such that light generated in the light emitting layer under one of the first or second electrodes strikes the light conversion layer and is converted to the second wavelength. In an addressable pixelated display, the light conversion layer and one of the first or second electrodes are parallel strips overlying one another. In the preferred embodiment of the present invention, the display also includes an encapsulation structure for preventing oxygen or water vapor from reaching the electrode layers or the light emitting layer.

DETAILED DESCRIPTION OF THE INVENTION

Figure 1:
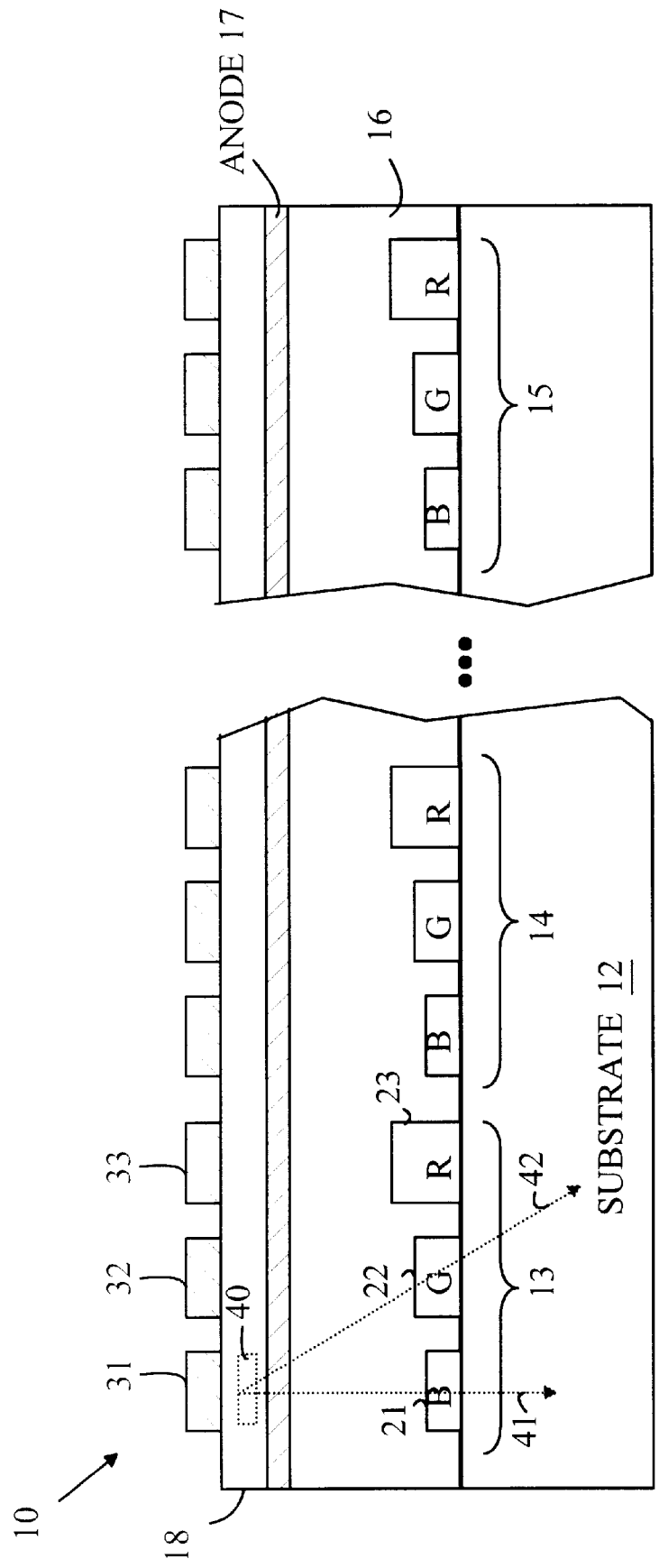
FIG. 1 is a cross-sectional view of a portion of a prior art OLED display.

The manner in which the present invention gains its advantages may be more easily understood with reference to FIG. 1 which is a cross-sectional view of a portion of a prior art OLED display 10 based on the color conversion methodology. Display 10 is constructed on a glass substrate 12. The light that is converted to the primary colors is generated in an EL layer 18. The light in EL layer 18 is generated by connecting row and column electrodes to the appropriate power supplies. For the purposes of this discussion, the row electrodes will be assumed to be the anode of the device, and the column electrodes will be assumed to be the cathode. The cross-sectional view shown in FIG. 1 is taken through one row electrode. The column electrodes run at right angles to the row electrodes. Typical column electrodes are shown at 31–33. Light generated at the intersection of a row and column electrode illuminates a color conversion strip that lies below the column electrode. The color conversion strips corresponding to electrodes 31–33 are shown at 21–23, respectively. Strip 21 converts the light emitted by layer 18 to blue light that escapes through the transparent glass substrate. Similarly, strip 22 converts light to green, and strip 23 converts the emitted light to red. The portion of the display shown in FIG. 1 includes the column electrodes for three full color pixels shown at 13–15.

When a potential difference is applied between electrodes 31 and 17 to generate the blue component of pixel 13, light from region 40 illuminates color conversion strip 21. This provides blue light in a direction normal to the display as shown at 41. Part of the light from region 40 will also illuminate color conversion strip 22 if the distance between emissive layer 18 and the color conversion strips is too large. Hence, green light will leave the display in direction 42 if the distance between the layers is too great.

The minimum distance between the color conversion strips and the light generation layer 18 is determined by the thickness of the planarization layer 16. As pointed out above, the difference in thickness between the red conversion strip and the other conversion strips dictates a minimum thickness for the planarization layer. In addition, additional thickness requirements are set by the material and planarization process. Hence, these prior art devices may suffer from off-axis color anomalies. In addition, the planarization process increases the cost of the devices, and the rigid glass substrates prevent the devices from flexing, as well as increasing the cost compared to fabrication on flexible substrates, which allow roll-to-roll processing.

Figure 2:
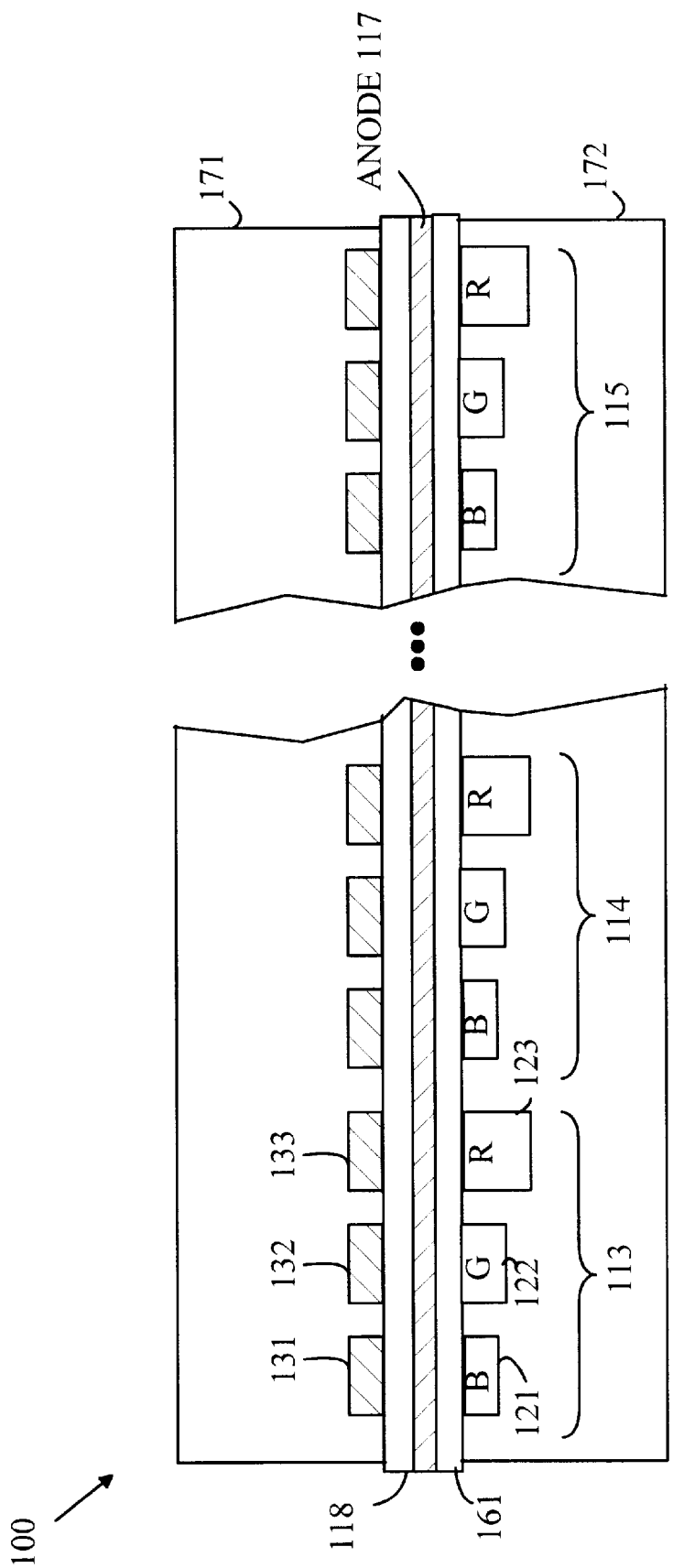
FIG. 2 is a cross-sectional view of a portion of an OLED display according to the present invention.

The present invention avoids these problems by constructing the display on a thin clear, flexible, plastic substrate and placing the color conversion strips on the opposite side of this substrate from the light emitting layers. Refer now to FIG. 2 which is a cross-sectional view of a OLED display 100 according to the present invention. To simplify the following discussion, those elements in FIG. 2 which provide analogous functions to elements shown in FIG. 1 have reference numbers differing by 100 from the elements shown in FIG. 1. FIG. 2 is also a cross-sectional view through one anode row electrode, anode 117. Exemplary cathode electrodes are shown at 131–133. The cathode electrodes run as strips of conducting material in a direction perpendicular to the anode electrodes. In the preferred embodiment of the present invention, the anode electrodes are constructed from patterned ITO deposited on a thin plastic sheet 161 which is typically 125 microns or less in thickness, and may be 25 microns or less. The preferred material for sheet 161 is poly (ethylene terephthalate), which is commonly called polyester, poly (ethylene naphthalate), or transparent polyimide. Other transparent polymers with good thermal and mechanical stability can also be used.

The various polymer layers that make up the light emitting and injection layers are deposited over the patterned anode electrodes. To simplify the drawing, these layers are shown as a single light emitting layer 118; however, it is to be understood that layer 118 may be constructed of a number of sub-layers that facilitate the injection of holes and electrons into an EL layer as described above. Since the fabrication of such a multilayer structure is conventional in the art, it will not be discussed in detail here. It is sufficient to note that the layers can be deposited by spin casting, dye sublimation, web coating, or various "printing" techniques depending on the particular material system chosen.

The cathode lines are constructed from a low workfunction material such as calcium or magnesium. Shadow masking techniques for depositing such electrodes are also well known in the art, and hence, will not be discussed in detail here.

In an OLED according to the present invention, the color conversion strips corresponding to the cathode electrodes are deposited on the opposite side of substrate 161 from the light emitting portion of the OLED. The color conversion strips corresponding to three pixels are shown at 113–115. The color conversion strips corresponding to cathode electrodes 131–133 are shown at 121–123, respectively. It should be noted that the distance between the light emitting area at the intersection of the anode and cathode electrodes and the color conversion strips is now determined solely by the thickness of plastic sheet 161. Hence, color anomalies resulting from the difference in thickness of the color conversion strips are eliminated. Furthermore, the thickness of the plastic sheet can be set to be less than the thickness of the corresponding planarized layer utilized in prior art devices, since transparent plastic substrates with thicknesses of between about 25 and 125 microns are common and easily processed, and thicknesses of less than 25 microns are possible with polyimide-based materials. Accordingly, the present invention can provide improved off-axis performance with respect to color anomalies. In addition, the need for a planarization layer is eliminated.

It should also be noted that devices fabricated on flexible substrates can be constructed on web processing equipment using roll to roll processing techniques that substantially reduce the cost of fabrication relative to techniques based on rigid glass substrates. This advantage is available regardless of whether the fabrication is based on vapor deposition, sublimation, liquid coating or printing techniques. It should also be noted that considerable savings can be realized even if some of the processing steps cannot be performed on roll to roll equipment. For example, the ITO deposition followed by the deposition of the light emitting layer 118 might be carried out on roll to roll equipment even if the deposition of the cathode and/or color conversion strips were not.

The color conversion materials can be applied directly to substrate 161 by any of the techniques described above.

Alternatively, these materials may be applied to a separate substrate, and the two substrates laminated together with the color conversion layer adjacent to the substrate 161. This is especially convenient if, for example, the color pattern is to be produced by an inkjet printer or similar device. In this case, the color conversion materials can be jet printed on a conventional overhead projector transparency film.

In general, the final displays need to be encapsulated to prevent oxygen and moisture from penetrating to the cathode electrodes and the light emitting layers. Such encapsulation layers are shown at 171 and 172 in FIG. 2. If the final device is to be rigid, the device may be encapsulated by sealing it against a transparent glass substrate having the desired curvature using a transparent bonding material. The back surface of the device, i.e., the surface containing the cathode electrodes, can be sealed using any barrier material that does not short the cathode electrodes. If the device is to remain flexible, then a flexible sealant can be applied to both sides of the device.

The above described embodiments have utilized color conversion strips that run parallel to the cathode electrodes. However, it will be obvious to those skilled in the art from the preceding discussion that embodiments in which the color conversion strips run parallel to the anode electrodes may also be constructed without deviating from the teachings of the present invention.

Displays in which an image is generated that does not depend on x-y addressable pixels may also be constructed using the present invention. For example, fixed images can be generated at different places on the display by utilizing a planar anode and patterning a portion of the cathode and the corresponding portion of the color conversion layer to match the image. A voltage applied to that portion of the cathode will then cause the desired image to "light up" on the display. A plurality of such sub-images can be incorporated in a display to form a display panel in which one or more messages or images are illuminated in response to the receipt of a predetermined signal. Since such a panel requires only the color and cathode to be patterned, the panel can be quickly, and economically, constructed from a blank panel in which the color conversion layers have not been deposited. Such material can be provided as a roll that is ready for cutting and patterning for the specific display.

In the simplest embodiment, only one image is to be displayed (although it may have arbitrary spatial and color complexity). The cathode of the preformed sheet is patterned with narrow cuts so as to isolate the desired light areas from the dark areas; this may be economically accomplished by, for example, removing material with a solid state laser. A separate sheet of plastic is then printed with a metallic image of the cathode pattern. Any metal will suffice; gold would be preferred for its inertness, ductility and ease of printing by electrodeposition or from organometallic inks that are well known in the art of printing. The various separate regions are connected together by printed interconnect metal, and this metal is covered by an insulating polymer (using, for example, an inkjet printer mechanism). This sheet is laminated against the cathode to provide the electrical contact. Finally, the color conversion materials are printed on the front of the substrate, as already described. The same method can be used to fabricate a display having a plurality of spatially separate images in which the images are displayed at different times.

Various modifications to the present invention will become apparent to those skilled in the art from the foregoing description and accompanying drawings. Accordingly, the present invention is to be limited solely by the scope of the following claims.

What is claimed is:

1. A display device comprising:
   a flexible sheet having first and second surfaces, said first and second surfaces being parallel to one another, said flexible sheet being transparent to light of a first wavelength;
   a first electrode comprising a first electrode layer in contact with said first surface, said first electrode layer being transparent to light of said first wavelength;
   a light emitting layer comprising an organic polymer in electrical contact with said first electrode layer;
   a second electrode comprising a second electrode layer in electrical contact with said light emitting layer, said light emitting layer generating light of said first wavelength when a potential difference is applied across said first and second electrodes; and
   a light conversion layer in contact with said second surface, said light conversion layer absorbing light of said first wavelength and emitting light of a second wavelength.

2. The display of claim 1 wherein said flexible sheet is less than 125 microns.

3. The display of claim 1 wherein said light conversion layer and one of said first or second electrodes are patterned such that light generated in said light emitting layer under one of said first or second electrodes strikes said light conversion layer and is converted to said second wavelength.

4. The display of claim 1 wherein said light conversion layer and one of said first or second electrodes comprises parallel strips overlying one another.

5. The display of claim 1 further comprising an encapsulation structure for preventing oxygen or water vapor from reaching said electrode layers or said light emitting layer.

6. A method for fabricating a display device, said method comprising the steps of:
   depositing a first electrode comprising a first electrode layer on a first surface of a flexible sheet having first and second surfaces, said first and second surfaces being parallel to one another, said flexible sheet being transparent to light of a first wavelength, said first electrode layer being transparent to light of said first wavelength;
   depositing a light emitting layer comprising an organic polymer in electrical contact with said electrode layer;
   depositing a second electrode comprising a second electrode layer in electrical contact with said light emitting layer, said light emitting layer generating light of said first wavelength when a potential difference is applied across said first and second electrodes; and
   depositing a light conversion layer in contact with said second surface, said light conversion layer absorbing light of said first wavelength and emitting light of a second wavelength.

7. The method of claim 6 wherein said light conversion layer and one of said first or second electrodes are patterned such that light generated in said light emitting layer under one of said first or second electrodes strikes said light conversion layer and is converted to said second wavelength.

8. The method of claim 6 wherein said light conversion layer and one of said first or second electrodes comprises parallel strips overlying one another.

9. The method of claim 6 further comprising the step of encapsulating said display in a structure that prevents oxygen or water vapor from entering said display.

* * * * *